US010553816B2

(12) United States Patent
Kamiyama

(10) Patent No.: US 10,553,816 B2
(45) Date of Patent: Feb. 4, 2020

(54) DISPLAY DEVICE

(71) Applicant: JOLED INC., Tokyo (JP)

(72) Inventor: Isao Kamiyama, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/864,365

(22) Filed: Jan. 8, 2018

(65) Prior Publication Data

US 2018/0315802 A1 Nov. 1, 2018

(30) Foreign Application Priority Data

Apr. 27, 2017 (JP) .................................. 2017-088636

(51) Int. Cl.
*H01L 29/74* (2006.01)
*H01L 21/00* (2006.01)
*H01L 51/52* (2006.01)
*H01L 27/32* (2006.01)

(52) U.S. Cl.
CPC ...... *H01L 51/5246* (2013.01); *H01L 27/3246* (2013.01)

(58) Field of Classification Search
CPC .................................................. H01L 51/5246
USPC .............................. 438/31, 42; 257/118, 127
See application file for complete search history.

(56) References Cited

U.S. PATENT DOCUMENTS

| 9,507,211 | B2* | 11/2016 | Tomioka | ........... | G02F 1/133788 |
|---|---|---|---|---|---|
| 9,583,550 | B2* | 2/2017 | Tada | ................... | H01L 27/3279 |
| 9,947,896 | B2* | 4/2018 | Sakamoto | ........... | H01L 51/5253 |
| 10,003,045 | B2* | 6/2018 | Suzuki | ................ | H01L 51/5259 |
| 10,069,105 | B2* | 9/2018 | Hong | .................. | H01L 27/3258 |
| 2006/0033429 | A1 | 2/2006 | Fujimura et al. | | |
| 2012/0062107 | A1 | 3/2012 | Fujimura et al. | | |
| 2013/0249385 | A1 | 9/2013 | Fujimura et al. | | |

FOREIGN PATENT DOCUMENTS

| JP | 5251358 | 7/2013 |
|---|---|---|
| WO | 2010/100922 | 9/2010 |

* cited by examiner

*Primary Examiner* — Calvin Lee
(74) *Attorney, Agent, or Firm* — Greenblum & Bernstein, P.L.C.

(57) ABSTRACT

According to one embodiment, a display device includes a display area, a first peripheral area, an organic insulating film. The display area is provided on a substrate and includes a plurality of organic electroluminescent (EL) elements aligned. The first peripheral area is provided on the substrate, around the display area. The organic insulating film is provided on the substrate and covers a circuit including a drive circuit driving the organic EL elements. The organic insulating film comprises a first groove provided in the organic insulating film, around the display area, in an area between the display area and the first peripheral area, and a dummy area to which at least one of functional materials of the organic EL elements is applied, on the first peripheral area.

21 Claims, 13 Drawing Sheets

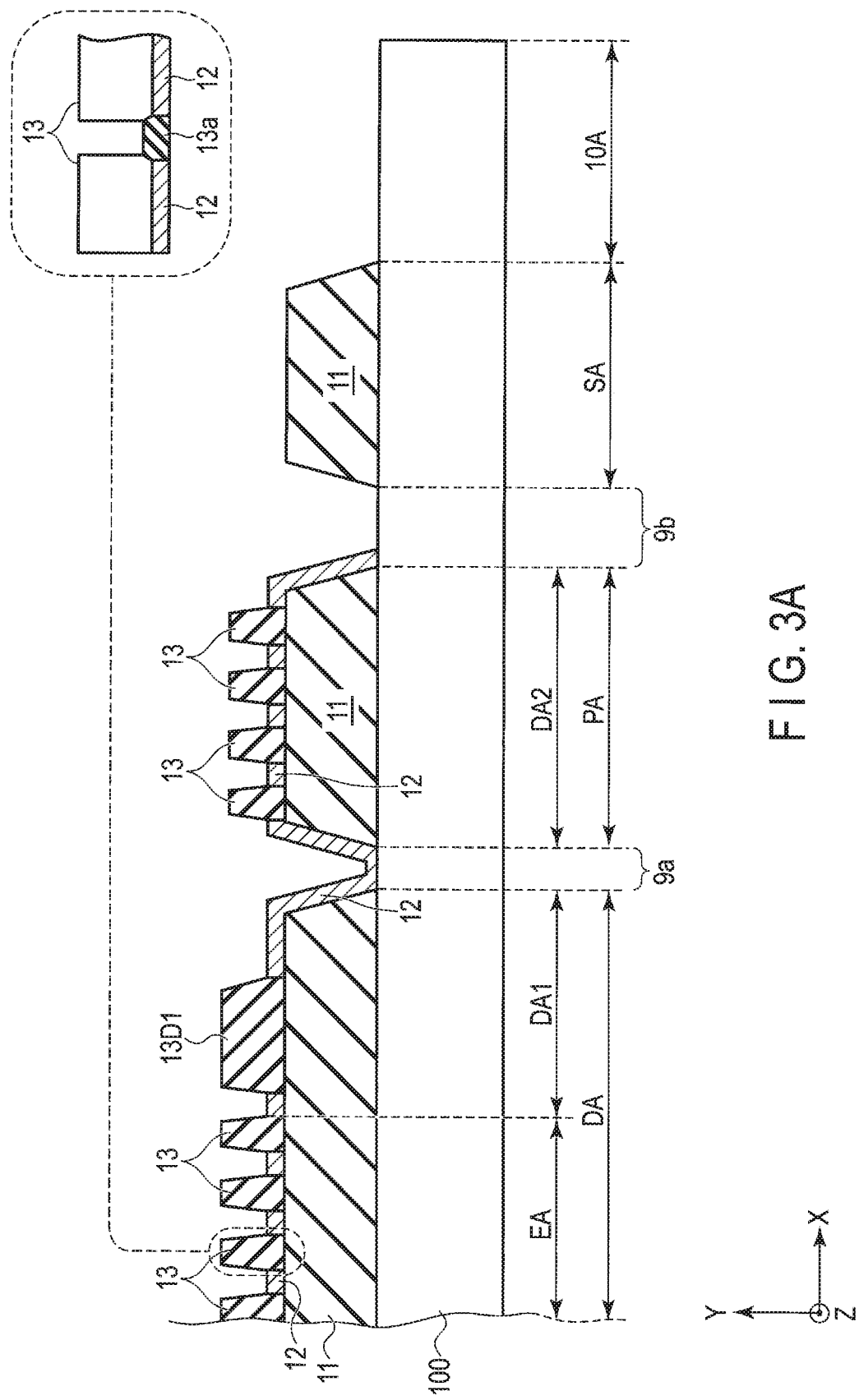
F I G. 3A

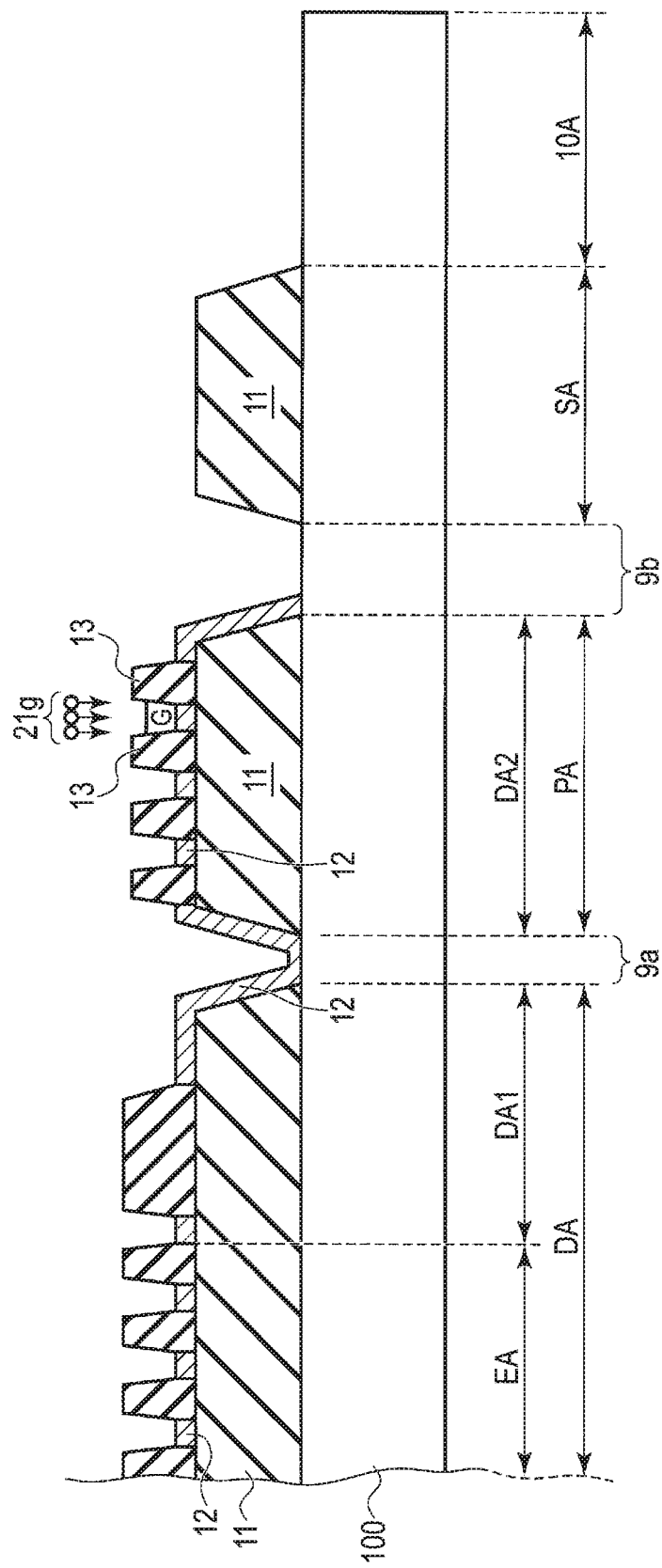
F I G. 3B

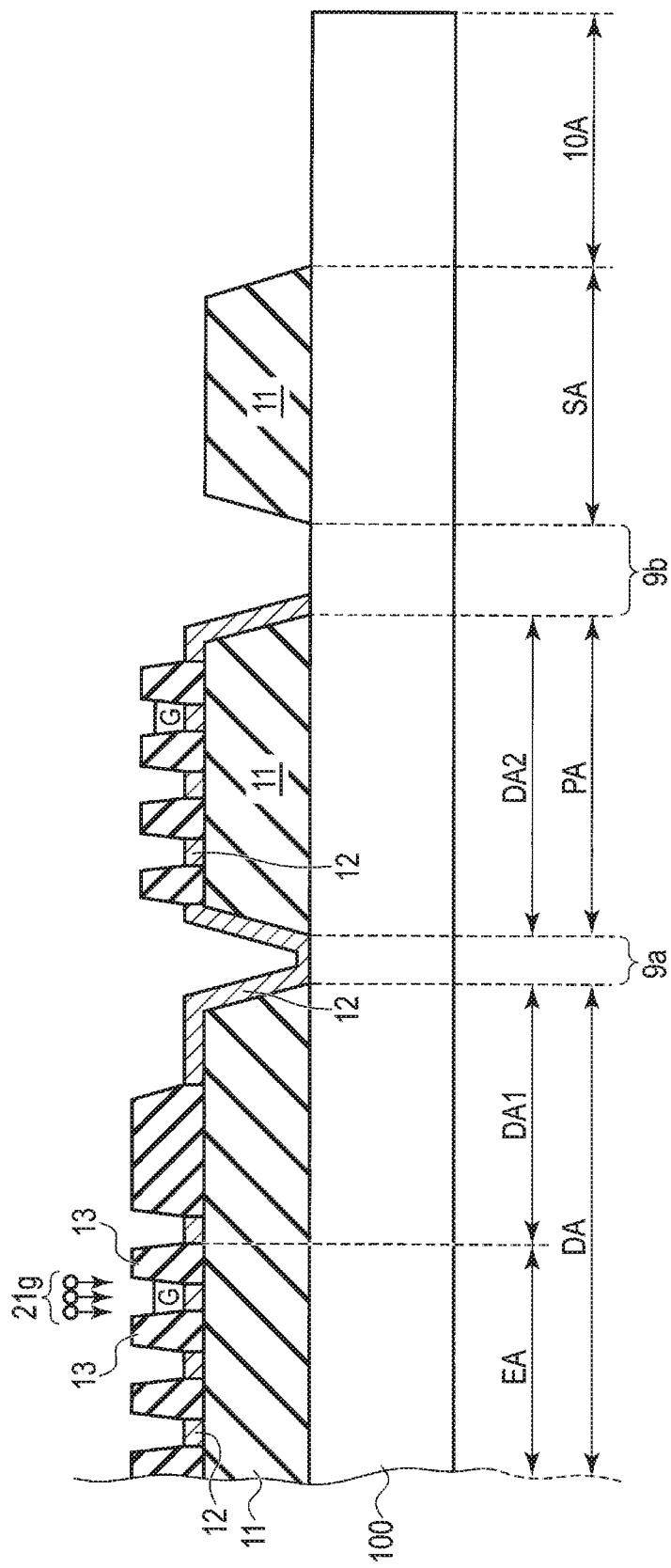
F I G. 3C

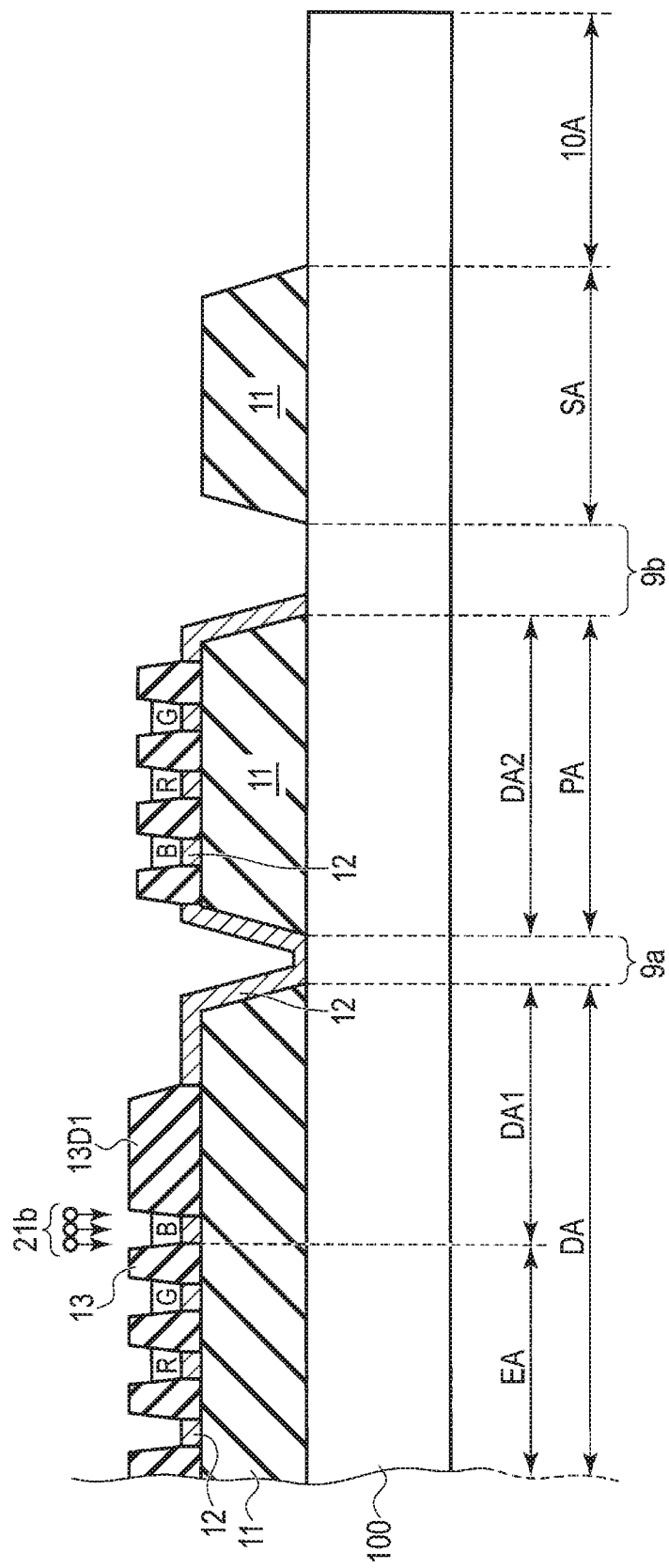
F I G. 3E

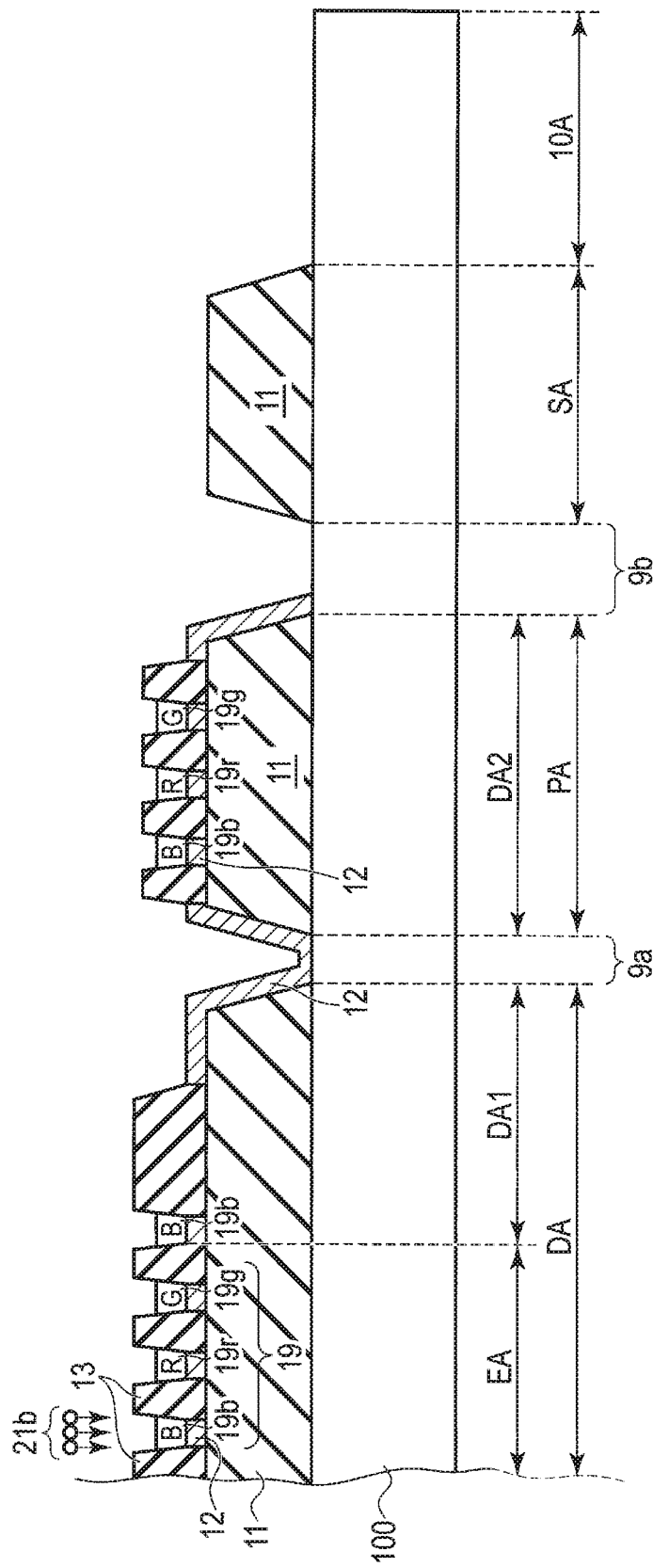
F I G. 3F

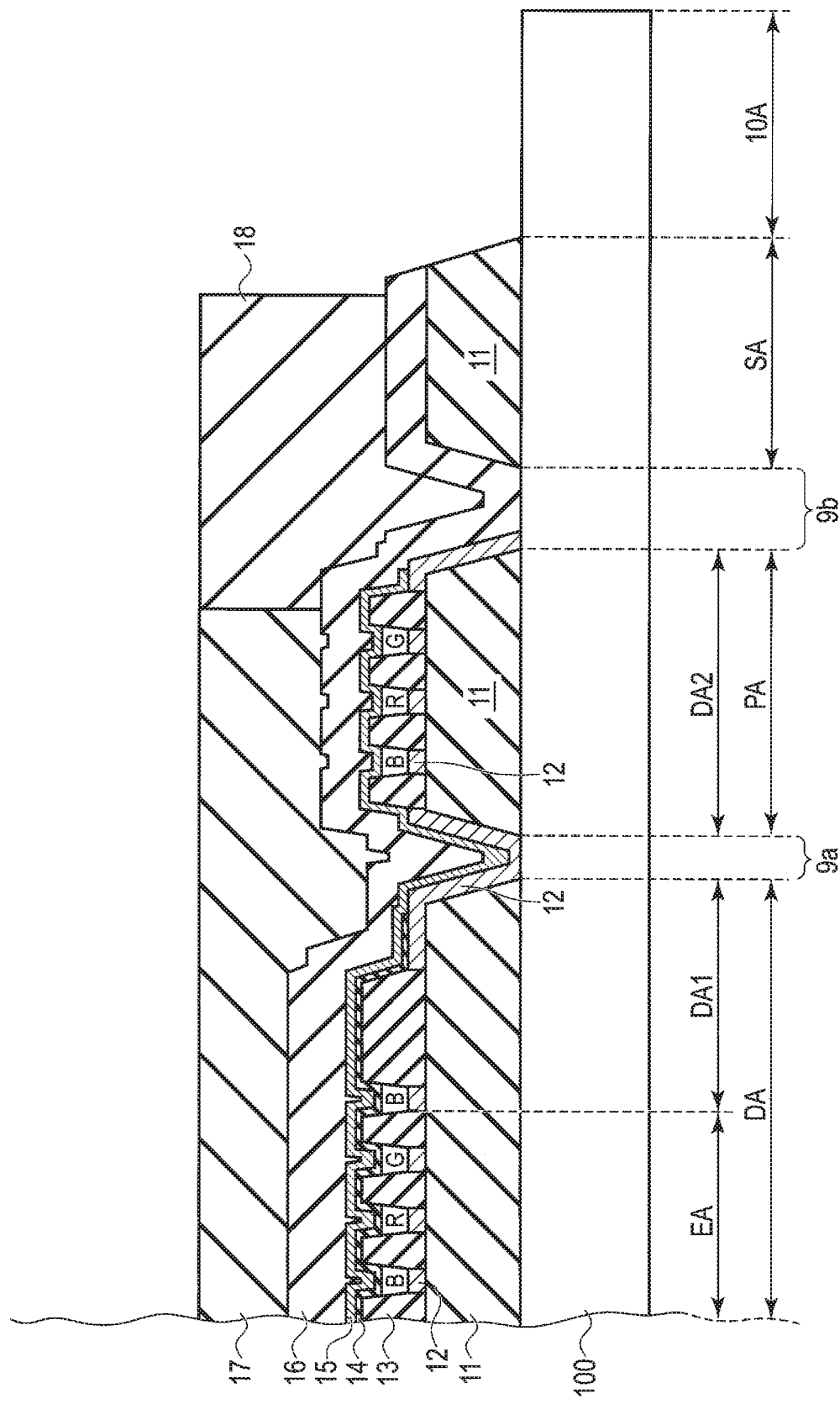
F I G. 3G

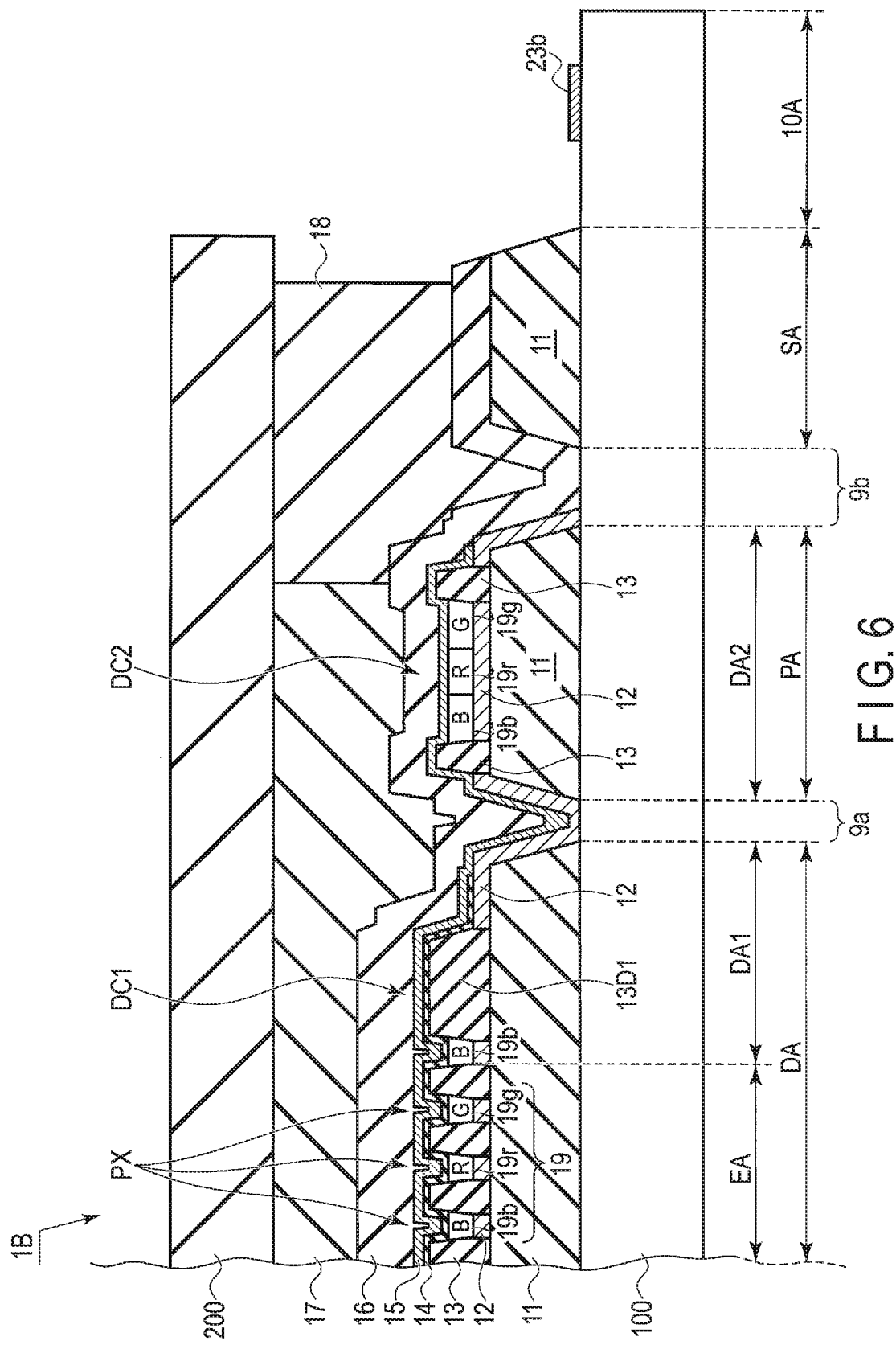
F I G. 6

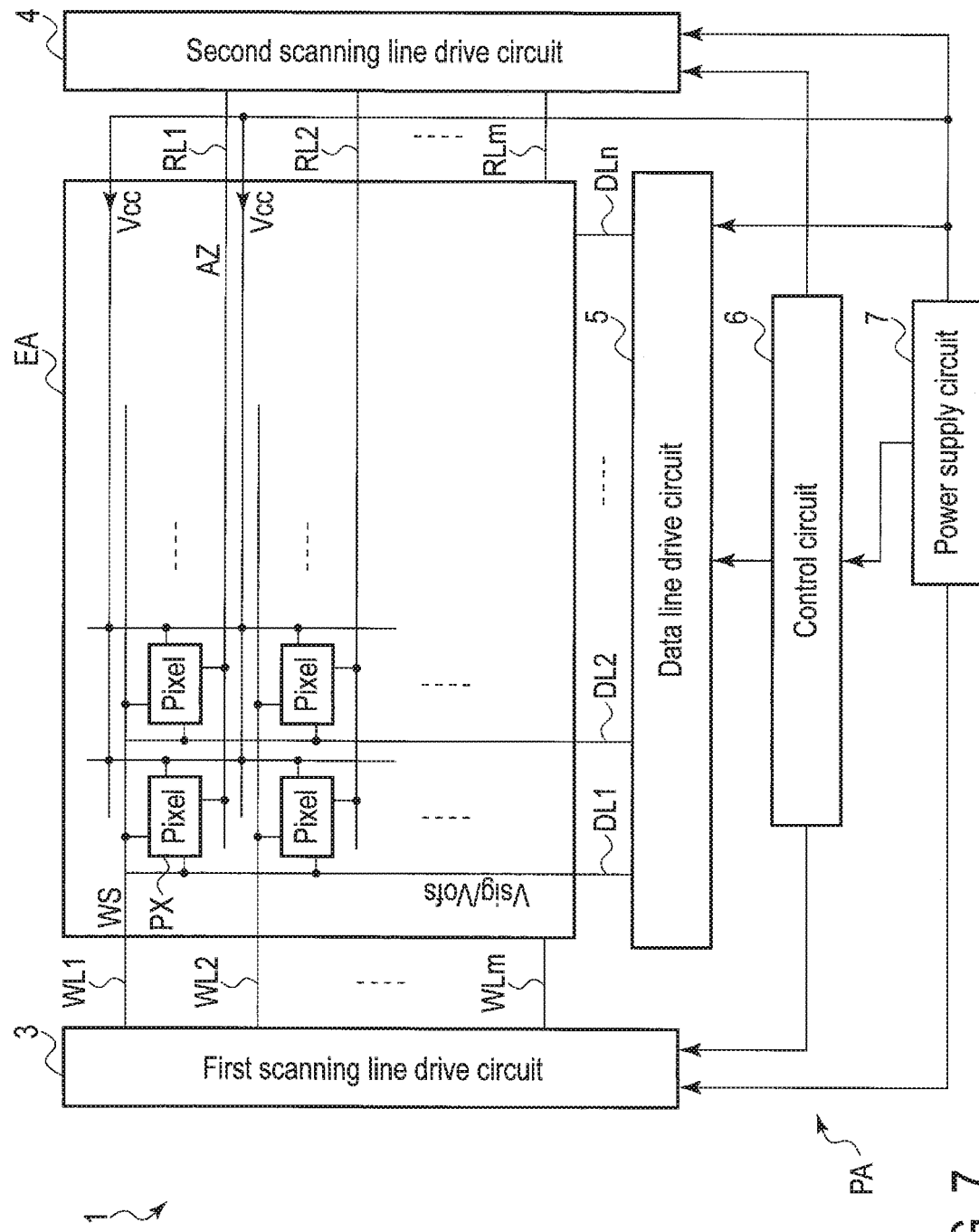
F I G. 7

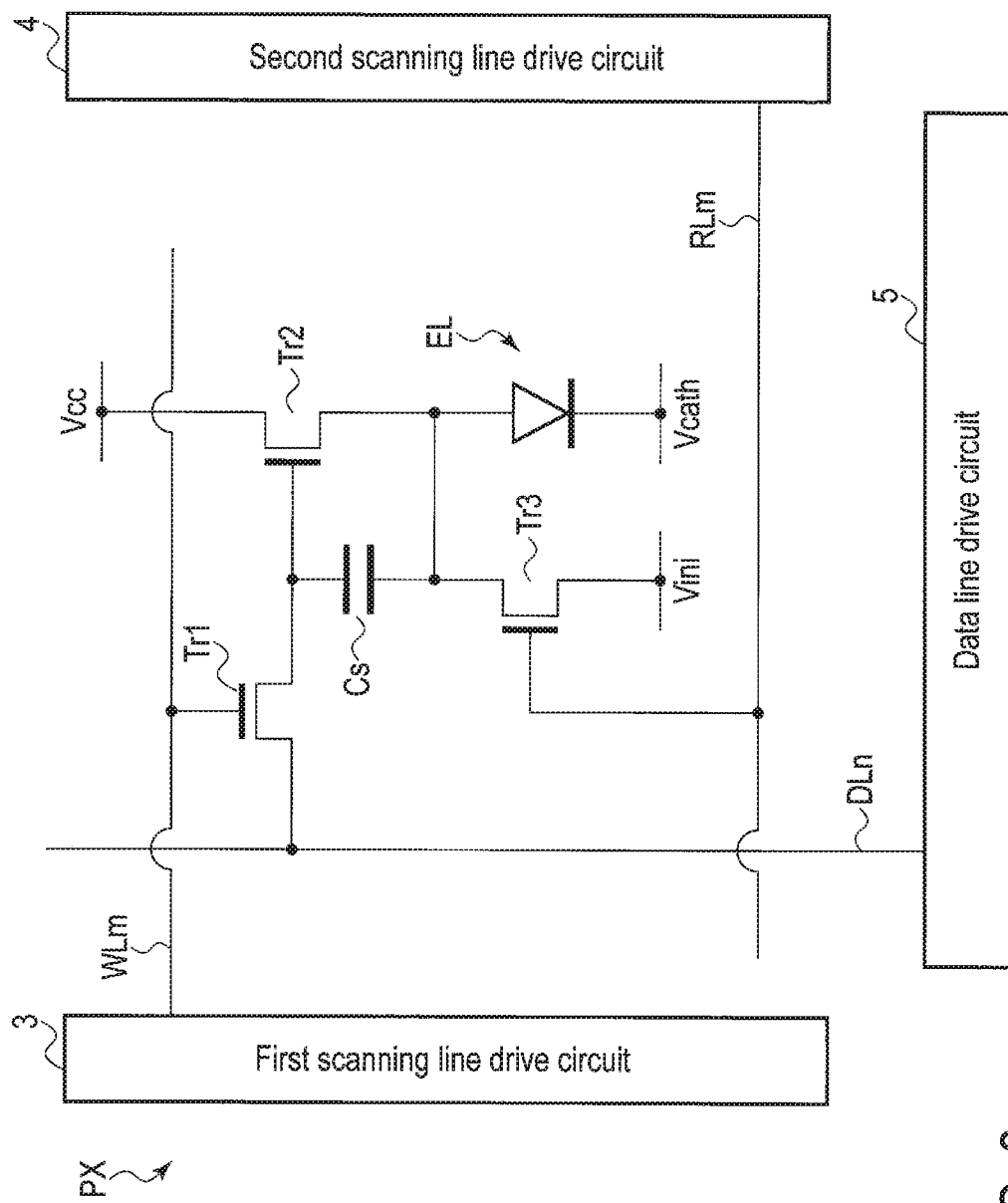
F I G. 8

DISPLAY DEVICE

CROSS-REFERENCE TO RELATED APPLICATIONS

This application is based upon and claims the benefit of priority from Japanese Patent Application No. 2017-088636, filed Apr. 27, 2017, the entire contents of which are incorporated herein by reference.

FIELD

Embodiments described herein relate generally to an organic electroluminescent display device having, for example, a plurality of organic light-emitting elements aligned.

BACKGROUND

An organic EL device using electroluminescence (hereinafter called EL) of an organic material comprises an electron-transport layer and an organic light-emitting layer between an anode electrode and a cathode, electrode, and is well known as a light-emitting element capable of low voltage drive and high-luminescence light emission.

For this reason, attention has been recently focused on display devices using organic EL devices, such as TV, smartphones, tablet terminals, and personal computers.

In the display device, for example, the inside of the display area defined by a wall (bank) is coated with ink containing an organic light-emitting material, organic light-emitting layer is formed by drying the coated ink, and the organic EL device is manufactured.

If the coated ink is merely dried, however, the organic light-emitting layer at a central portion of the display area is dried with ink existing in the surrounding but the organic light-emitting layer at a peripheral portion of the display area is dried with no ink existing in the surrounding. For this reason, non-uniformity in drying occurs at the organic light-emitting layer at the central portion and the organic light-emitting layer at the peripheral portion, in the display area. For this reason, the light emission property of the organic light-emitting layer may become non-uniform due to the non-uniformity in drying. In this case, the peripheral area different in light emission property from the central portion may be regarded as a dummy area which is not a valid display area. For increase in productivity, the valid display area is required to be larger as compared with the size of the entire body of the substrate.

The embodiments provide a display device capable of making the valid display area larger as compared with the size of the entire body.

BRIEF DESCRIPTION OF THE DRAWINGS

FIG. 3A is a cross-sectional view showing steps of manufacturing the display device according to the embodiments.

FIG. 3B is a cross-sectional view showing the manufacturing steps following FIG. 3A.

FIG. 3C is a cross-sectional view showing the manufacturing steps following FIG. 3B.

FIG. 3E is a cross-sectional view showing the manufacturing steps following FIG. 3D.

FIG. 3F is a cross-sectional view showing the manufacturing steps following FIG. 3E.

FIG. 3G is a cross-sectional view showing the manufacturing steps following FIG. 3F.

FIG. 6 is a cross-sectional view showing a modified example of the embodiments.

FIG. 7 is a block diagram showing an example of a display device to which the embodiments are applicable.

FIG. 8 is a circuit diagram showing one of pixels shown in FIG. 7.

DETAILED DESCRIPTION

Figure 1:
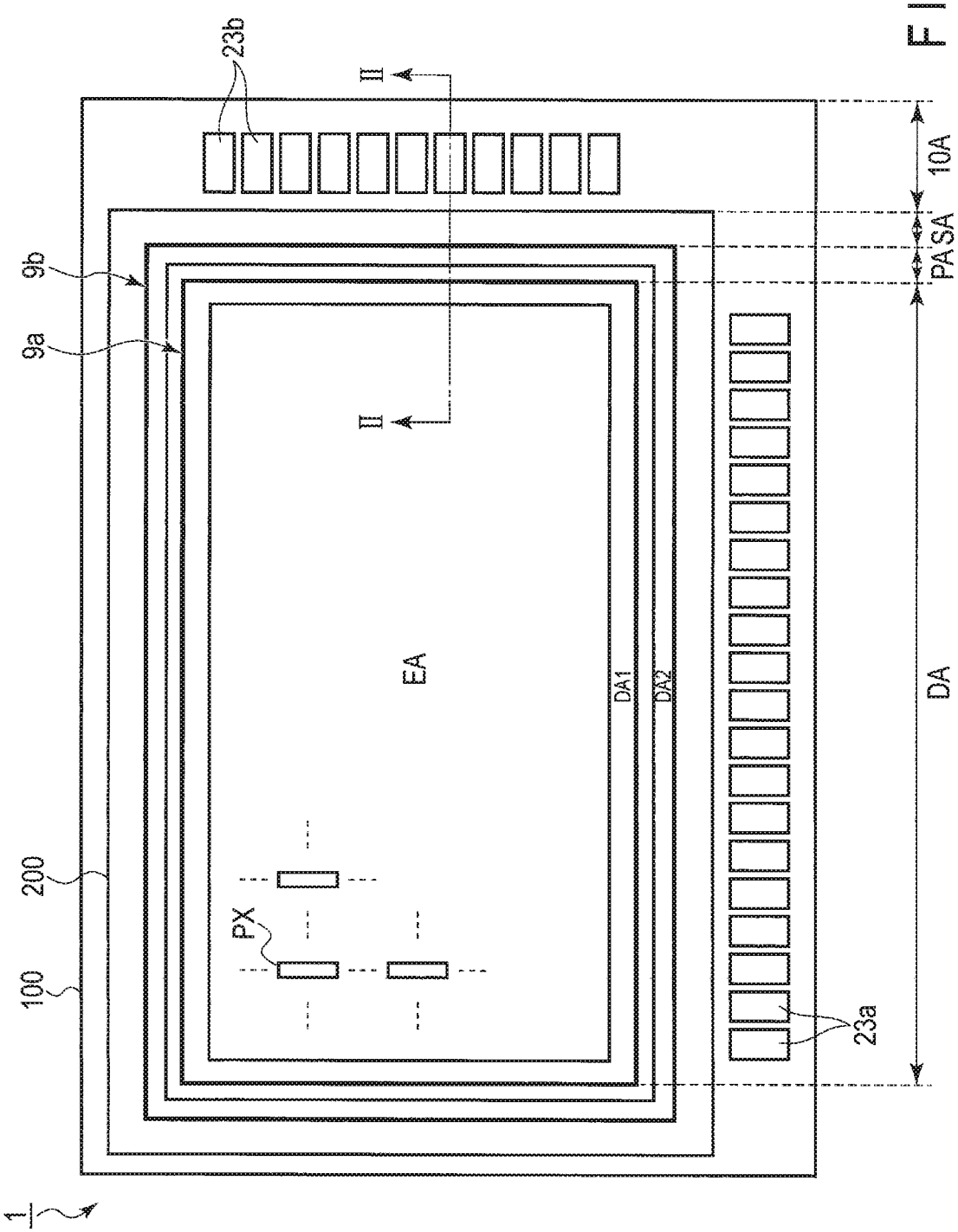
FIG. 1 is a plan view showing an entire configuration of a display device according to the embodiments.

In general, according to one embodiment, a display device includes a display area, a first peripheral area, an organic insulating film. The display area is provided on a substrate and includes a plurality of organic electroluminescent (EL) elements aligned. The first peripheral area is provided on the substrate, around the display area. The organic insulating film is provided on the substrate and covers a circuit including a drive circuit driving the organic EL elements. The organic insulating film comprises a first groove provided in the organic insulating film, around the display area, in an area between the display area and the first peripheral area, and a dummy area to which at least one of functional materials of the organic EL elements is applied, on the first peripheral area.

The embodiments will be explained hereinafter with reference to the accompanying drawings. In the following descriptions, substantially the same functions and constituent elements are denoted by the same reference numerals and explained as needed. In addition, the figures are schematic, and a relationship between the thickness and the planar dimensions, a proportion of thickness of layers and the like may be different from actual elements.

Embodiments

[Configuration]

FIG. 1 is a plan view schematically showing a configuration of a display device according to the present embodiments. A display device 1 is, for example, an organic EL display device.

The display device 1 according to the embodiments comprises a display area EA including a plurality of pixels PX that are organic EL emitting elements arranged in a matrix on a substrate 100. Each of the pixels PX includes an organic light-emitting layer formed of an organic light-emitting material of any one of red (A), green (C), and blue (B) between an anode electrode and a cathode electrode. The pixel PX is separated from each other by walls called banks which will be explained later.

A first dummy area DA1 is provided around the display area DA. The first dummy area DA1 is surrounded by the banks and includes at least one first dummy pixel which can hold a coating solution. In the embodiments, the first dummy pixel has the same structure as the pixel PX.

A peripheral area PA is provided around the display area EA. The peripheral area PA includes various drive circuits to be explained later that drive each of the pixels PX in the display area EA.

A sealing area SA including a sealing film which serves as a sealing material to seal the display area EA is provided around the peripheral area PA.

In addition, a first separation groove (hereinafter simply called a first groove) 9a is provided between the first dummy area DA1 and the peripheral area PA to separate the areas from each other. A second separation groove (hereinafter simply called a second groove) 9b is provided between the peripheral area PA and the sealing area SA to separate the areas from each other. The first groove 9a and the second groove 9b are formed by removing a planarizing layer on the substrate 100 as explained later. The organic light-emitting material may be degraded when absorbing moisture and the like. For this reason, water and the like are prevented from entering the pixel area DA from the surrounding at two steps by providing the first groove 9a and the second groove 9b around the pixel area DA.

A second dummy area DA2 is provided in the peripheral area PA between the first groove 9a and the second groove 9b. The second dummy area DA2 is surrounded by the banks and includes at least one second dummy pixel which can hold a solution to be applied. In the embodiments, the second dummy pixel has the same structure as the pixel PX.

A terminal area 10A including predetermined terminals 23a and 23b for electric connection between the display area EA and the outside is provided on either side of the row direction and the columnar direction of the display area EA, in the surrounding of the sealing area SA.

The pixel area DA, the peripheral area PA, and the sealing area SA are covered with a sealing glass 200, and the sealing glass 200 is disposed to be opposed to the substrate 100.

Figure 2:
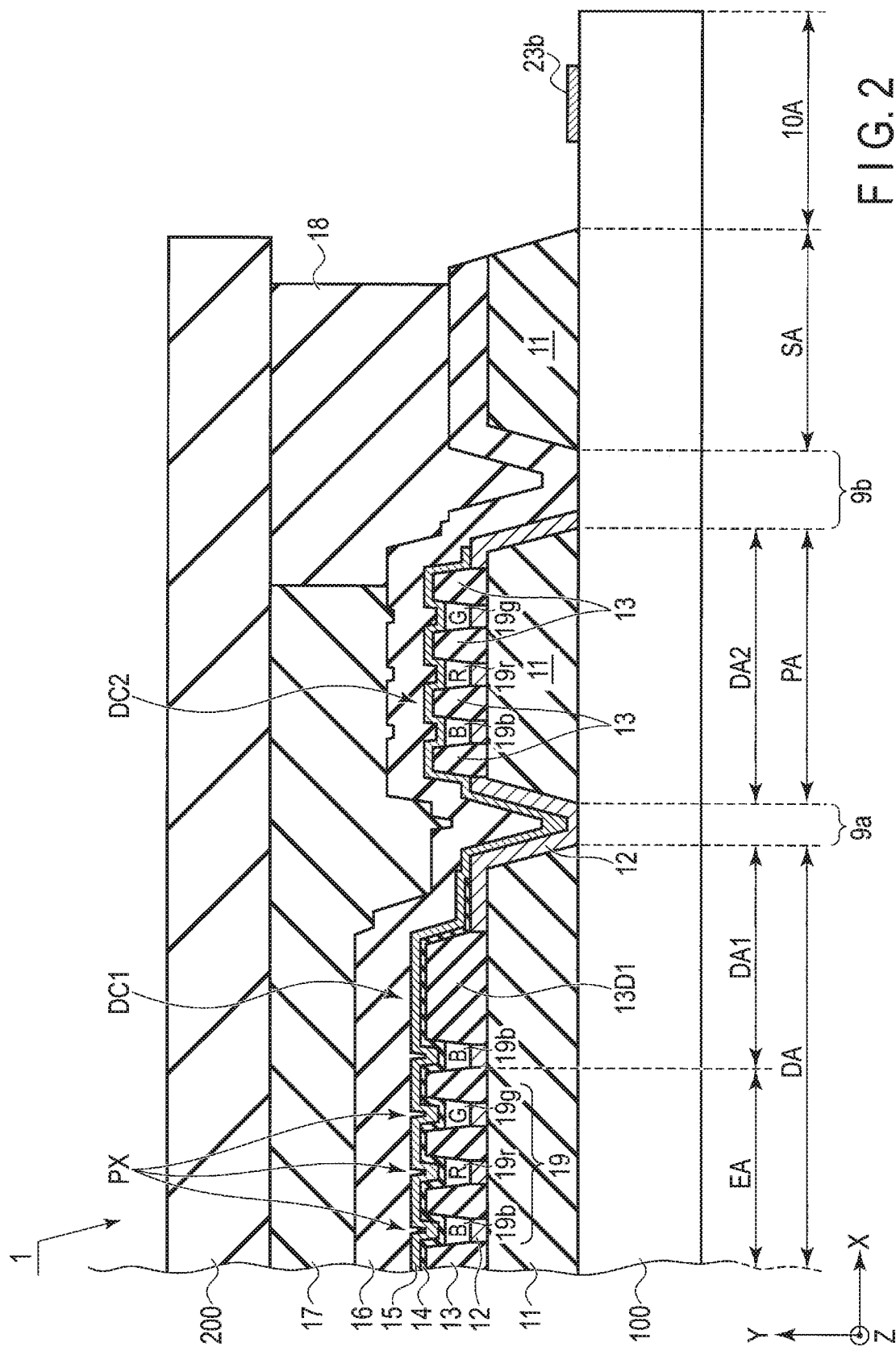
FIG. 2 is a cross-sectional view seen along line II-II in FIG. 1.

FIG. 2 is a cross-sectional view seen along line II-II in FIG. 1.

As shown in FIG. 2, a planarizing layer 11 is provided on the substrate 100. The planarizing layer 11 is formed of, for example, an organic insulating film of polyimide or the like, and covers various drive circuits and the like. The first groove 9a is formed in the planarizing layer 11 around the display area EA while the second groove 9b is formed in the planarizing layer 11 around the peripheral area PA.

A plurality of anode electrode layers 12 are provided on the planarizing layer 11 in the display area EA, the first groove 9a, and the peripheral area PA. The anode layers 12 are formed of, for example, a predetermined metal material.

Each of the pixels PX disposed in the display area EA comprises an organic light-emitting layer 19 (19b, 19r, and 19g) formed of an organic light-emitting material of three colors, red (R), green (G), and blue (B), an electron transport layer 14, a cathode electrode layer 15, and a sealing film 16.

The organic light-emitting layers 19b, 19r, and 19g are separated from each other by a linear first bank (as shown in FIG. 3A) provided between the anode electrode layers 12, and a plurality of linear second banks 13 and 13D1 provided on both sides of the organic light-emitting layers 19b, 19r, and 19g.

The second banks 13 and 13D1 extend in the columnar direction. (i.e., direction of arrow Z in the figure) and separate the pixels PX of different colors from each other. In addition, the first bank is disposed in a direction (i.e., direction of arrow X in the figure) intersecting the second banks 13 and 13D1.

The first bank is lower in height than the second banks 13 and 13D1. For this reason, if ink which is a functional material (light-emitting material) is applied by moving a head (not shown) in, for example, an ink-jet method, as explained later, surplus ink of the ink applied to each pixel PX can move to an adjacent pixel beyond the first bank when the organic light-emitting layer 19 is formed. The thickness of the ink on the pixels PX can be therefore made uniform and the luminance of the pixels can be equalized.

The electron transport layer 14 is provided on the organic light-emitting layer 19 and the second banks 13 and 13D1 to improve efficiency of recombination between holes and electrons implanted in the light-emitting layer 19.

The cathode electrode layer 15 is provided on the electron transport layer 14 and formed of, for example, a predetermined metal material.

At least one dummy pixel is disposed in the first dummy area DA1. At least one type of ink to be applied to the pixels PX is applied to the dummy pixel. In FIG. 2, for example, a first dummy pixel DC1 of one color is disposed. The first dummy pixel DC1 comprises, for example, a blue organic light-emitting layer 19b. The second bank 13D1 may be formed of the same material as the second bank 13 of the pixel PX and, in the dummy area, for example, the width of the second bank 13D1 may be the same as the width of the second bank 13 in the display area EA. In the dummy area, the width of the second ban 13D1 may be larger than the width of the second bank 13 in the display area EA to further increase process margin for bank defect.

At least one dummy pixel is disposed in the second dummy area DA2. At least one type of ink to be applied to the pixels PX is applied to the dummy pixel. In FIG. 2, for example, second dummy pixels DC2 of three colors are disposed. In other words, the second dummy pixels DC2 comprise, for example, a blue organic light-emitting layer 19b, a red organic light-emitting layer 19r, a green organic light-emitting layer 19g, and the bank 13.

A sealing film 16 for sealing the pixels PX is provided on the above-explained structure in the pixel area DA, the peripheral area PA, and the sealing area SA.

A filler layer 17 is formed on the sealing film 16 in the pixel area DA and the peripheral area PA.

A sealing member 18 for bonding the sealing glass 200 is provided on the sealing film 16 in the sealing area SA. The sealing member 18 may be provided on a part of the sealing area SA and the peripheral area PA.

In the terminal area 10A, the terminals 23a and 23b are provided on the substrate 100 (but the terminal 23b alone is shown in FIG. 2).

If a predetermined voltage is applied between the anode electrode layer 12 and the cathode electrode layer 15, in the above-explained structure, red (R), green (G), and blue (B) light beams are emitted from the organic light-emitting layer 19 of the pixels PX. Since the first dummy pixel and the second dummy pixel have the same structure as the pixels PX, in the embodiments, the manufacturing conditions can be confirmed by measuring the properties of the pixels.

The planarizing layer 11 on the substrate 100 may cover a circuit formation layer (not shown). The circuit formation layer includes various drive circuits to be explained later.

[Manufacturing Method]

FIG. 3A to FIG. 3G are cross-sectional views showing steps of manufacturing the display device 1 according to the embodiments. The steps of manufacturing the display device 1 are not limited to those but can be modified.

As shown in FIG. 3A, first, various drive circuits and the like (not shown) are formed on the substrate 100, and the planarizing layer 11 to cover the substrate 100 on which various drive circuits and the like are formed is formed. The planarizing layer 11 is formed of, for example, an organic insulating film of polyimide or the like. Then, the first groove 9a is formed in the planarizing layer 11 around the display area EA (including the first dummy area DA1) while the second groove 9b is formed in the planarizing layer 11 around the peripheral area PA, by, for example, photolithography or the like. Then, the anode electrode layers 12 are formed on the planarizing layer 11 in the display area EA and the peripheral area PA. The anode electrode layers 12 are formed to correspond to the pixels of the respective colors. In addition, the material of the anode electrode layers 12 is also formed in several parts of the first groove 9a and the second groove 9b.

Then, a linear first bank 13a is formed between the anode electrode layers 12 corresponding to the pixel of the same color. The first bank 13a is arranged in, for example, the row direction (i.e., X direction in the figure) and the anode electrode layers 12 corresponding to the pixels of the same color are separated by the first bank 13a. The first bank 13a is formed of, for example, a material having an insulation property such as acrylic resin, polyimide-based resin or novolac phenol resin.

Then, the linear second banks 13 are formed on the display area EA and the second dummy area DA2, and the linear second bank 13D1 is formed on the first dummy area DA1. The second banks 13 and 13D1 are formed between the anode electrode layers 12 of different colors to separate the anode electrode layers 12 of different colors. The second banks 13 and 13D1 are made to extend in a direction intersecting the first bank 13a, for example, the columnar direction (i.e., Z direction in the figure). The second banks 13 and 13D1 are formed of, for example, a material having an insulation property such as acrylic resin, polyimide-based resin or novolac phenol resin, similarly to the first bank 13a. The second banks 13 and 13D1 are higher than the first bank 13a, and the organic light-emitting materials of different colors are thereby prevented from mixing.

As shown in FIG. 3B, for example, ink 21g which is the green organic light-emitting material is applied from an ink-jet printer head (not shown) (hereinafter simply called a head) in between the second banks 13, in the second dummy area DA2 by, for example, an ink-jet method.

After that, as shown in FIG. 3C, ink 21g which is the green organic light-emitting material is applied from the head (not shown) in between the second banks 13 of the display area EA.

Figure 3D:
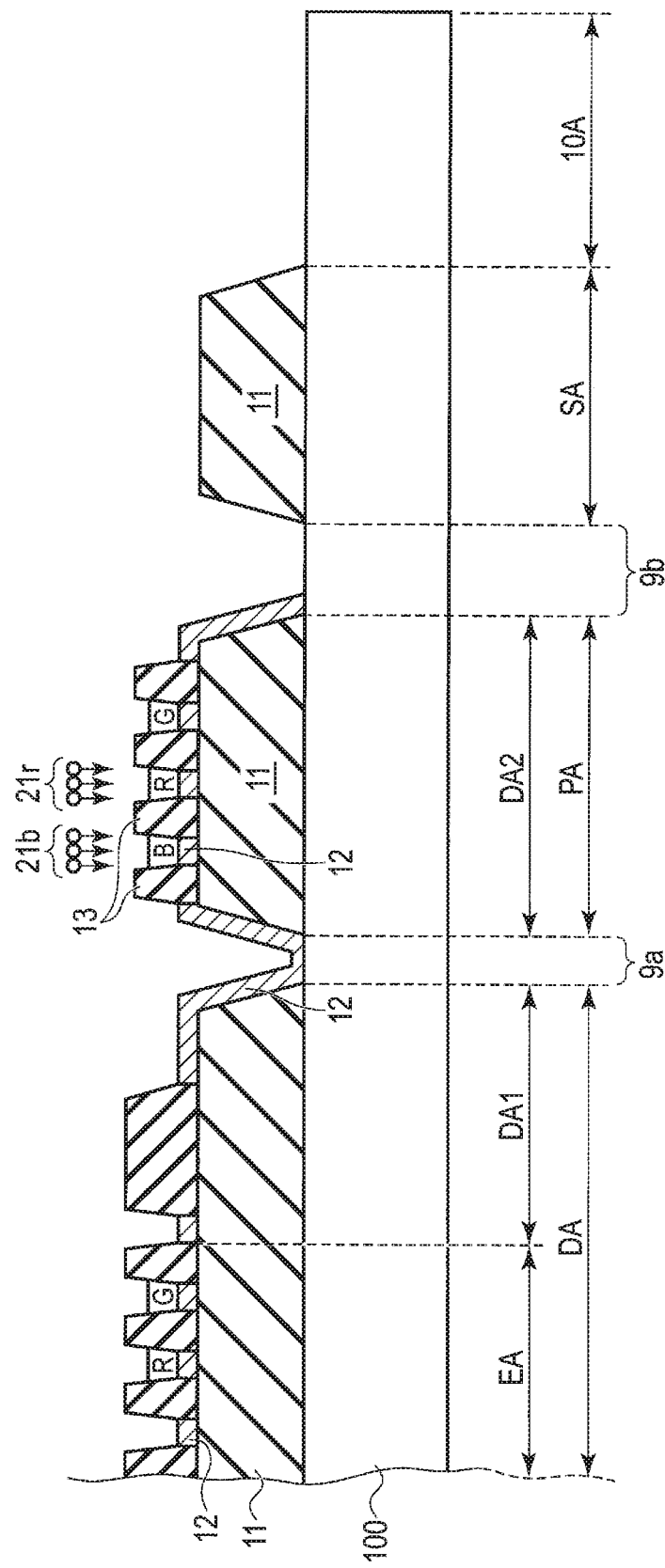
FIG. 3D is a cross-sectional view showing the manufacturing steps following FIG. 3C.

After that, as shown in FIG. 3D, ink 21r which is the red organic light-emitting material and ink 21b which is the blue organic light-emitting material are sequentially applied in between the second banks 13 of the second dummy area DA2 and the display area EA.

After that, as shown in FIG. 3E, ink 21b which is the blue organic light-emitting material is applied in between the first banks 13 in the first dummy area DA1 by the same method.

After that, as shown in FIG. 3F, ink 21b which is the blue organic light-emitting material is applied in between the first banks 13 in the display area EA by the same method.

For example, the same ink as that in the display area EA is used as the ink 21b applied to the first dummy area DA1 and the second dummy area DA2. An ink applying device can be simplified by commonly using the nozzle to apply the ink to the first dummy area DA1 and the second dummy area DA2 and the nozzle to apply the ink to the display area EA. In addition, the same solvent as that of the ink for pixels may be discharged.

The ink applying method is not limited to the above-explained example but, for example, the ink can be sequentially applied to the areas in order of the second dummy area DA2, the first dummy area DA1 and the display area EA while changing the ink of the head.

The thickness of the ink applied to the display area EA is made equal to the thickness of the ink applied to the first dummy area DA1 and the second dummy area DA2. The time to dry the ink in the display area EA can be equalized by making the ink thickness equal. To equalize the light emission property of the display area EA, the thickness of the ink applied to the first dummy area DA1 and the second dummy area DA2 may be varied as needed. In other words, drying conditions at the central part and the peripheral part of the display area EA may be equalized by making the thickness of the ink applied to the first dummy area DA1 and the second dummy area DA2 larger than, for example, the thickness of the ink applied so the display area EA.

Then, the ink applied to the first dummy area DA1, the second dummy area DA2, and the display area EA is dried, the organic light-emitting layers 19r, 19g, and 19b of three colors are formed in the second dummy area DA2, the blue organic light-emitting layer 19b is formed in the first dummy area DA1, and the organic light-emitting layers 19r, 19g, and 19b of three colors are formed in she display area EA.

Then, as shown in FIG. 3G, the electron transport layer 14 is formed on the organic light-emitting layers in the display area EA and the first dummy area DA1. Then, the cathode electrode layer 15 formed continuously on the electron transport layer 14 in the display area EA and the first dummy area DA1, on the structure in the peripheral area PA, in the first groove 9a. After that, the sealing film 16 is formed on the above-explained structure in the pixel area DA, the peripheral area PA, and the sealing area SA, and in the first groove 9a and the second groove 9b. The filler layer 17 is formed on the sealing film 16 in the pixel area DA and the peripheral area PA, and the sealing member 18 is formed on the sealing film 16 in the sealing area SA. For this reason, the second groove 9b is filled with the sealing member 18.

After that, the sealing glass 200 is brought into close contact with the surface of the filler layer 17 and the sealing member 18, and the display device 1 shown in FIG. 1 and FIG. 2 is completed.

Advantages

According to the embodiments, the display area EA and the first dummy area DA1 are provided together with the second dummy area DA2 in the peripheral area, the ink is applied between the second banks 13 and 13D1 in the display area EA, the first dummy area DA1, and the second dummy area DA2, and the applied ink is dried. For this reason, the ink applied to the display area EA is dried together with the ink applied to the first dummy area DA1 and the ink applied to the second dummy area DA2 located on the outer side of the first dummy area DA1. Therefore, the steam concentration distribution of the solvent of the ink at the peripheral portion of the display area EA and the steam concentration distribution of the solvent of the ink at the central portion of the display area EA become uniform, and the evaporation speed of the solvent can be equalized. In other words, the dry state of the ink applied to the display area EA and the dry state of the ink applied to the first dummy area DA1 and the second dummy area DA2 can be equalized, and non-uniformity in dry state can be reduced. As a result, non-uniformity in display in the display area EA1 can be reduced, and reduction in the display area EA can be prevented.

Figure 4:
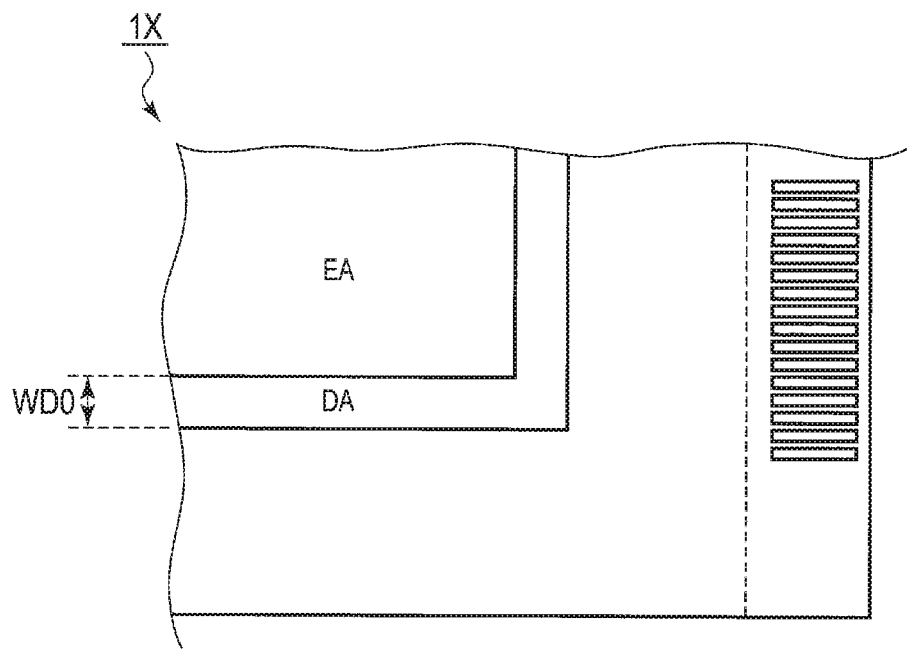
FIG. 4 is a plan view showing a display device according to a comparative example.

FIG. 4 is a plan view showing a display device according to a comparative example, illustrating a part of the display device. As shown in FIG. 4, a display device 1X according to the comparative example merely comprises the dummy area DA in the surrounding of the display area EA, and does not comprise the second dummy area DA2 according to the embodiments. For this reason, the ink of the display area EA is dried in a state in which the ink applied to the dummy area DA1 exists. As a result, in the splay device 1X according to the comparative example, non-uniformity in display resulting from non-uniformity in dry state occurs at the central portion and the peripheral portion of the display area EA, and non-uniformity in light emission property occurs at the central portion and the peripheral portion of the display area EA, For example, a width WD0 of the dummy area DA according to the comparative example is approximately 1 mm.

Figure 5:
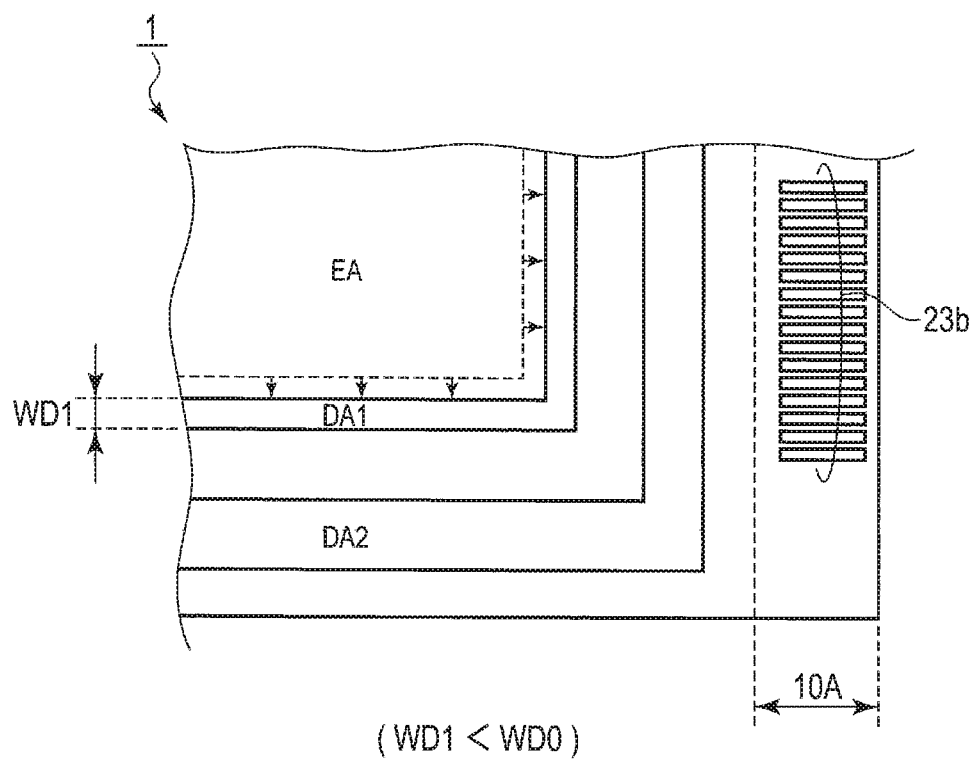
FIG. 5 is a plan view showing the display device according to the embodiments.

In contrast, FIG. 5 is a plan view showing the display device 1 according to the embodiments. As shown in FIG. 5, the display device 1 according to the embodiments comprises the second dummy area DA2 including at least one dummy pixel on the further outer peripheral side of the first dummy area DA1. For this reason, the ink applied to the display area EA and the first dummy area DA1 is dried in a state in which the ink 21b, 21r, and 21g is applied to the second dummy area DA2. Therefore, uniformity in the steam concentration distribution of the ink can be improved at the peripheral portion and the central portion of the display area EA, and equalization in the evaporation speed of the solvent can be enhanced. For this reason, non-uniformity in dry state of the ink in the overall display area EA can be reduced, and non-uniformity in display in the display area EA can be reduced. The width of the first dummy area DA1 and the width of the second dummy area DA2 are determined in accordance with the specifications of the panel and the uniformity in light emission in the display area EA.

A width WD1 of the first dummy area DA1 according to the embodiments is, for example, equal to or smaller than approximately 0.1 mm, and can be reduced by approximately one tenth or less as compared with the width WD0 of the dummy area DA0 according to the comparative example. In other words, the width of the first dummy area DA1 can be minimized, and the display area EA can be expanded.

Furthermore, since the second dummy area DA2 is provided in the peripheral area PA which is a redundant area, increase in the panel size of the display device 1 can be prevented.

In addition, since the ink in the second dummy area DA2 is formed by the coating method, the ink can be applied while avoiding the first groove 9a, the second groove 9b, and the like that affect the reliability of the display device 1. Therefore, reduction in reliability of the display device 1 can be prevented.

Furthermore, in the embodiments, the first dummy area DA1 and the second dummy area DA2 can be used as areas of a preliminary applying step to improve the position accuracy of the ink ejected from the head. More specifically, if the head for applying the ink is not used for a long time, the dry ink may be deposited on the tip and the inside of the nozzle constituting the ink jet, the nozzle may be clogged, ink ejection failure may occur, and the position accuracy of the ejected ink may become worse. However, the position accuracy of the ink ejected to the display area EA can be improved and yields of the display area EA can be improved by preliminarily ejecting the ink in the first dummy area DA1 and the second dummy area DA2.

In addition, the same ink as the ink 21r, 21g, and 21b of three colors, red (R), green (G), and blue (B) applied to the display area EA can be applied to the second dummy area DA2. Thus, the dry state of the ink of all colors applied to the display area EA can be equalized.

The ink 21r, 21g, and 21b of three colors, red (R), green (G), and blue (B) does not need to be applied to the second dummy area DB2 but, for example, ink of one or two colors may be applied. In this case, the step of applying the ink can be simplified and the manufacturing costs can be reduced.

In addition, the ink does not need to be separated in the second dummy area DA2. For example, the ink 19b, 19r, and 19g of three colors may be mixed similarly to a display device 1B shown in FIG. 6. In this case, the amount of the ink 19b, 19r, and log of three colors applied to the second dummy area DA2 is determined in accordance with the uniformity in light emission of the display area EA. In other words, for example, the amount of the ink is determined in accordance with a difference between the light emission amount at the central portion and the light, emission amount at the peripheral portion, in the display area EA. However, the amount of the ink is not limited to this.

Furthermore, the number of colors of the ink applied to the second dummy area DA2 is not limited to three as shown in FIG. 6 but, for example, the ink of two colors or the most inexpensive one color may be applied. In this case, too, the amount of the ink of two colors or one color applied to the second dummy area DA2 is determined in accordance with the uniformity in light emission of the display area EA, similarly to the above-explained case.

In addition, the first dummy area DA1 and the second dummy area DA2 are the areas where the dummy pixels DC1 and DC2 which do not function as the pixels PX are disposed. For this reason, the dummy pixel areas DA1 and DA2 may have a structure holding the applied ink or the solvent dissolving the functional material and functioning as enclosures which prevent the ink or the solvent from flowing and affecting the other areas. The enclosing structure may be, for example, a structure which is composed of the bank similarly to the display area EA and which is capable of blocking the applied solution. In the first dummy area DA1 and the second dummy area DA2, for example, the first bank which does not have the function of blocking the solution can be omitted.

Furthermore, the ink applied to the first dummy area DA1 and the second dummy area DA2 does not need to be the same as the ink applied to the display area EA but, for example, may be the ink in which the organic light-emitting material as dye is more reduced than the ink applied to the display area EA.

In addition, to equalize the drying conditions of the display area EA, the only solvent excluding the organic light-emitting material may be applied to the first dummy area DA1 and the second dummy area DA2. In this case, since the expensive organic light-emitting material does not need to be applied, the manufacturing costs can be reduced.

Moreover, the color of the organic light-emitting layer of the first dummy pixel DC1 is not limited to one color but the organic light-emitting layers of a plurality of colors may be provided.

(Application Example (Display Device to which the Embodiments are Applicable))

A display device to which the embodiments are applicable will be explained with reference to FIG. 7 and FIG. 8. FIG. 7 schematically shows an example of the display device 1 to which the embodiments are applicable. The display device 1 is, for example, an active matrix display device comprising the organic EL element.

The display device 1 comprises the above-explained display area EA, and a first scanning line drive circuit 3, a second scanning line drive circuit 4, a data line drive circuit 5, a control circuit 6, and a power supply circuit 7, which are provided in the peripheral area PA around the display area EA.

The display area EA includes a plurality of pixels PX arrayed in a matrix. The pixels PX arranged in the row direction are connected to a plurality of first scanning lines WL (WL1 to WLm) connected to the first scanning line drive circuit 3, and a plurality of second scanning lines RL (RL1 to RLm) connected to the second scanning line drive circuit 4. The pixels arranged in the columnar direction which intersects the row direction are connected to a plurality of data lines DL (DL1 to DLn) connected to the data line drive circuit 5. Each of m and n is a positive integer.

The first scanning line drive circuit 3 sequentially supplies write scan signals WS to the first scanning lines WLm. The pixels PX arranged in the row direction are sequentially selected.

The second scanning line drive circuit 4 sequentially supplies drive scan signals AZ to the second scanning lines RL, synchronously with the write scan signals WS supplied by the first scanning line drive circuit 3. The light emitting operation and the light extinguishing operation of the pixels PX are thereby controlled.

The data line drive circuit 5 selectively supply, for example, a signal voltage Vsig and a reference voltage Vofs to the data lines DLn. The signal voltage Vsig is a voltage of a signal corresponding to luminance of the video signal. The reference voltage Vofs is a voltage which is a reference to the signal voltage, and corresponds to, for example, a voltage of a signal indicating a black level.

The control circuit 6 generates various signals necessary to drive the first scanning line drive circuit 3, the second scanning line drive circuit 4, and the data line drive circuit 5, based on external signal supplied from an external signal source. The power supply circuit 7 supplies power to the first scanning line drive circuit 3, the second scanning line drive circuit 4, and the data line drive circuit 5, and the control circuit 6.

FIG. 8 schematically shows an example of a drive circuit of the pixel PX. The drive circuit is not limited to this.

The pixel PX comprises a write transistor Tr1, a drive transistor Tr2, a reset transistor Tr3, a capacitance element Cs, and, a light emitting element EL. Each of the write transistor Tr1, the drive transistor Tr2, and the reset transistor Tr2 is, for example, a thin-film transistor (TFT). Either of a bottom-gate thin-film transistor and a top-gate thin-film transistor can be employed as the thin-film transistor.

In the write transistor Tr1, a gate electrode is connected to the first scanning line WLm, either of source/drain electrodes is connected to the data line DLn and the other is connected to a first electrode of the capacitance element Cs and a gate electrode of the drive transistor Tr2.

In the write transistor Tr2, either of source/drain electrodes is connected to a line to which a power source voltage Vcc is supplied, and the other is connected to an anode electrode (for example, anode electrode layer 12 shown in FIG. 2) of the light emitting element EL, a second electrode of the capacitance element Cs, and either of source/drain electrodes of the reset transistor Tr3. A cathode voltage Vcath is supplied to a cathode electrode of the light emitting element EL.

A gate electrode of the reset transistor Tr3 is connected to the second scanning line RLm, and the other source/drain electrodes is connected to a line to which a fixed voltage Vini is supplied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display area provided on a substrate and including a plurality of organic electroluminescent (EL) elements aligned;
a first peripheral area provided on the substrate, around the display area; and
an organic insulating film provided on the substrate and covering a circuit including a drive circuit driving the organic EL elements,
wherein
the organic insulating film comprises:
a first groove provided in the organic insulating film, around the display area, in an area between the display area and the first peripheral area; and
a dummy area to which at least one of functional materials of the organic EL elements is applied, on the first peripheral area, at least one of the functional materials of the organic EL elements being a same material as a material applied on a first electrode included in the organic EL elements.

2. The device according to claim 1, wherein
the organic EL elements in the display area comprise one of the functional materials applied to an area between banks, and
the dummy area includes at least one of the functional materials applied to the area between the banks on the organic insulating film.

3. The device according to claim 1, further comprising:
a second peripheral area provided on the substrate, around the first peripheral area; and
a second groove provided in the organic insulating film, around the first peripheral area, in an area between the first peripheral area and the second peripheral area.

4. The device according to claim 1, further comprising:
at least one of the functional materials of the organic EL elements provided in an area between the display area and the first groove and applied onto the organic insulating film.

5. The device according to claim 1, further comprising:
a second electrode provided between the dummy area and at least one of the functional materials.

6. A display device comprising:
a display area provided on a substrate and including a plurality of organic electroluminescent (EL) elements aligned;
a first peripheral area provided on the substrate, around the display area; and
an organic insulating film provided on the substrate and covering a circuit including a drive circuit driving the organic EL elements,
wherein the organic insulating film includes a first groove provided in the organic insulating film, around the display area, in an area between the display area and the first peripheral area, the organic EL elements include light emitting layers partitioned by banks, and the first peripheral area includes an enclosure holding one of a solvent solving functional materials of the light emitting layers and ink obtained by solving the functional materials on the first peripheral area, the functional materials and the ink being same materials as materials applied on a first electrode included in the organic EL elements.

7. The device according to claim 6, wherein the organic EL elements in the display area comprise one of the functional materials applied to an area between the banks, and the first peripheral area includes one of the solvent solving the functional materials of the light emitting layers applied to the area between the banks and the ink obtained by solving the functional materials, on the organic insulating film.

8. The device according to claim 6, further comprising:

a second peripheral area provided on the substrate, around the first peripheral area, wherein the organic insulating film includes a second groove provided in the organic insulating film, around the first peripheral area, in an area between the first peripheral area and the second peripheral area.

9. The device according to claim 6, further comprising:

at least one of the functional materials of the organic EL elements provided in an area between the display area and the first groove and applied onto the organic insulating film.

10. The device according to claim 6, further comprising:

a second electrode provided in the enclosure, the one of the solvent and the ink being applied on the second electrode.

11. A display device comprising:

a display area provided on a substrate and including a plurality of organic electroluminescent (EL) elements aligned;

a first peripheral area provided on the substrate, around the display area; and an organic insulating film provided on the substrate and covering a circuit including a drive circuit driving the organic EL elements, wherein the organic insulating film comprises:
 a first groove provided in the organic insulating film, around the display area, in an area between the display area and the first peripheral area; and
 a dummy area to which at least one of functional materials of the organic EL elements is applied, on the first peripheral area, the display area includes a first dummy pixel adjacent the first groove, and the dummy area on the first peripheral area includes a second dummy pixel adjacent the first groove, opposite the first dummy pixel.

12. The device according to claim 11, wherein the organic EL elements in the display area comprise one of the functional materials applied to an area between banks, and the dummy area includes at least one of the functional materials applied to the area between the banks on the organic insulating film.

13. The device according to claim 11, further comprising:

a second peripheral area provided on the substrate, around the first peripheral area; and a second groove provided in the organic insulating film, around the first peripheral area, in an area between the first peripheral area and the second peripheral area.

14. The device according to claim 11, wherein each of the first dummy pixel and the second dummy pixel excludes only an organic light-emitting material from the functional materials which is applied to the organic EL elements.

15. The device according to claim 11, further comprising:

at least one of the functional materials of the organic EL elements provided in an area between the display area and the first groove and applied onto the organic insulating film.

16. The device according to claim 11, wherein each of the first dummy pixel and the second dummy pixel includes a functional material different than the functional materials of the organic EL elements.

17. The device according to claim 11, wherein a width of a bank in the display area defining the first dummy pixel is larger than widths of banks in the display area defining the organic EL elements.

18. The device according to claim 11, wherein a width of a bank in the display area defining the first dummy pixel is same as widths of banks in the display area defining the organic EL elements.

19. The device according to claim 11, wherein each of the first dummy pixel and the second dummy pixel has a same structure as the organic EL elements.

20. The device according to claim 11, wherein the first dummy pixel in the display area includes at least one of the functional materials which is applied to the organic EL elements, and the second dummy pixel in the dummy area includes at least one of the functional materials which is applied to the organic EL elements.

21. The device according to claim 20, wherein the first dummy pixel in the display area includes only one of the functional materials which is applied to the organic EL elements, and the second dummy pixel in the dummy area includes each of the functional materials which is applied to the organic EL elements.

* * * * *